(12) United States Patent
Lo et al.

(10) Patent No.: US 11,411,290 B2
(45) Date of Patent: Aug. 9, 2022

(54) HYBRID TRANSMISSION LINE

(71) Applicant: Intel Corporation, Santa Clara, CA (US)

(72) Inventors: Hungying L. Lo, Folsom, CA (US); Bok Eng Cheah, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 256 days.

(21) Appl. No.: 16/305,355

(22) PCT Filed: Jun. 30, 2016

(86) PCT No.: PCT/US2016/040357
§ 371 (c)(1),
(2) Date: Nov. 28, 2018

(87) PCT Pub. No.: WO2018/004594
PCT Pub. Date: Jan. 4, 2018

(65) Prior Publication Data
US 2020/0321674 A1 Oct. 8, 2020

(51) Int. Cl.
*H01P 3/08* (2006.01)
*H01P 3/02* (2006.01)
*H05K 1/02* (2006.01)
*H01L 23/498* (2006.01)

(52) U.S. Cl.
CPC .......... *H01P 3/08* (2013.01); *H01L 23/49838* (2013.01); *H01P 3/026* (2013.01); *H05K 1/0245* (2013.01)

(58) Field of Classification Search
CPC ...... H01P 3/08; H01P 3/026; H01L 23/49838; H05K 1/0245
See application file for complete search history.

(56) References Cited

U.S. PATENT DOCUMENTS

| 5,736,796 | A | * | 4/1998 | Price | H05K 1/0262 307/147 |
| 6,219,255 | B1 | * | 4/2001 | Teshome | H05K 1/0216 174/255 |
| 2005/0237126 | A1 | * | 10/2005 | Babb | H05K 1/0216 333/34 |
| 2005/0285695 | A1 | * | 12/2005 | Kim | H01P 3/081 333/33 |
| 2010/0225425 | A1 | * | 9/2010 | Cho | H01P 1/2013 333/238 |

* cited by examiner

*Primary Examiner* — Samuel S Outten
(74) *Attorney, Agent, or Firm* — Schwabe, Williamson & Wyatt, P.C.

(57) ABSTRACT

One embodiment provides an apparatus. The apparatus includes a first signal trace and a current return path. The current return path includes a plurality of portions. The plurality of portions includes a first portion, a second portion and a third portion. The first portion is included in a first power plane. The second portion is included in a second power plane coplanar with the first power plane and separated from the first power plane by a split. The third portion spans the split and is included in a reference voltage plane. The reference voltage plane is coplanar with the first signal trace. The reference voltage plane is separated from the first power plane and the second power plane by a dielectric material.

21 Claims, 4 Drawing Sheets

HYBRID TRANSMISSION LINE

CROSS-REFERENCE TO RELATED APPLICATIONS

This patent application is a U.S. National Phase Application under 35 U.S.C. § 371 of International Application No. PCT/US2016/040357, filed on Jun. 30, 2016, the entire contents of which is hereby incorporated by reference herein.

FIELD

The present disclosure relates to a transmission line, in particular to, a hybrid transmission line.

BACKGROUND

Integrated circuits and/or printed circuit boards may contain a plurality of layers. Each layer may contain one or more of a signal trace, a reference voltage trace, a reference voltage plane and/or a power plane. Each signal trace has an associated current return path configured to carry electrical current. Each signal trace and associated current return path may correspond to a waveguide and/or transmission line. In one example, the signal trace and associated current return path may be coplanar. In another example, the signal trace may be included in a first layer and the associated current return path may be included in a second layer (e.g., reference voltage plane), separated from the first layer by an insulating material, e.g., a dielectric.

A characteristic impedance associated with each signal trace and associated current return path, is related to a distance between the signal trace and associated current return path. Variation in distance can cause undesirable variation in characteristic impedance. Maintaining relatively tight tolerances for signal traces and coplanar associated current return paths may increase manufacturing costs. An additional reference layer that includes a reference voltage plane may be added to provide the current return path. The additional reference layer may increase package size (e.g., thickness) and associated cost (e.g., manufacturing).

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1:
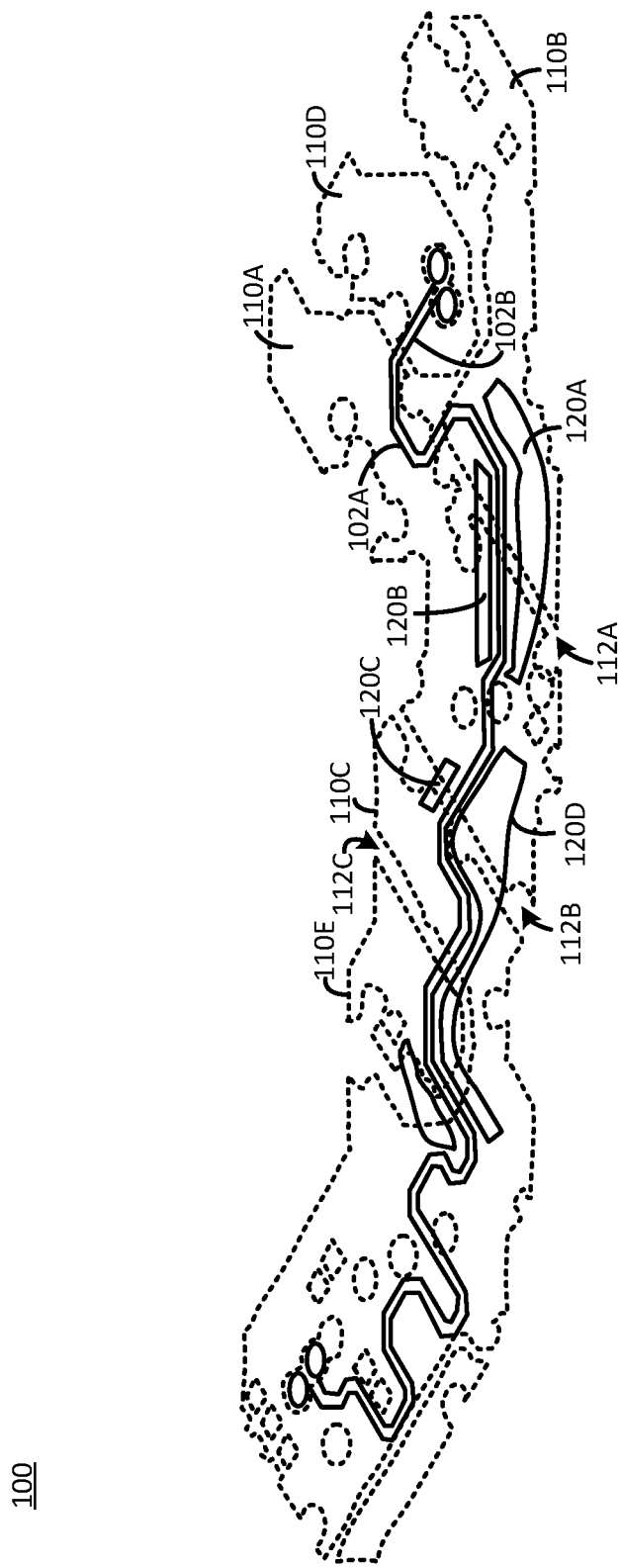
FIG. 1 is a sketch illustrating portions of two layers of a system consistent with one embodiment of the present disclosure.

Although the following Detailed Description will proceed with reference being made to illustrative embodiments, many alternatives, modifications, and variations thereof will be apparent to those skilled in the art.

DETAILED DESCRIPTION

In some devices, a layer may include a plurality of isolated power planes (i.e., "split power planes") where each power plane is separated from each adjacent power plane by a split (i.e., a gap). The split may contain an insulating material, e.g., a dielectric material. Split power planes may be used, for example, to isolate power sources that supply digital circuitry from power sources that supply analog circuitry. Power plane voltages may differ between individual power planes.

Generally, this disclosure relates to a hybrid transmission line. The hybrid transmission line includes a signal trace (i.e., conductor) and a current return path. The current return path includes a portion that is coplanar with the signal trace and a portion that is not coplanar with the signal trace. For example, the signal trace and a portion of the current return path may be included in a first layer and a portion of the current return path may be included in a second layer. The second layer is adjacent the first layer and separated from the first layer by a dielectric material. The first layer includes a plurality of conductive traces and/or conductive planes, including the signal trace and one or more reference voltage planes. As used herein, "reference voltage plane" includes reference voltage planes and/or reference voltage traces. The second layer includes a plurality of split power planes, each power plane separated from each adjacent power plane by a split. The split may contain an insulating material, e.g., a dielectric material. Each power plane is associated with a respective supply voltage. The reference voltage plane is associated with a reference voltage, VSS. For example, VSS may be zero (i.e., ground). In another example, VSS may be greater than or less than zero. The reference voltage, VSS, differs from the supply voltages associated with the power planes. In other words, a voltage difference ΔV between a power plane and the reference voltage plane is nonzero. The hybrid transmission line may be included in a device, including, but not limited to, an integrated circuit, a printed circuit board (PCB), a system on a chip, a system in a package, etc.

In an embodiment, a first portion of the current return path is included in a first power plane, a second portion of the current return path is included in a second power plane coplanar with the first power plane and the third portion of the current return path is included in a reference voltage plane. A reference voltage associated with the reference voltage plane differs from respective power plane voltages of the first power plane and the second power plane. The second power plane is adjacent the first power plane and separated from the first power plane by a split. The third portion of the current return path, and thus the reference voltage plane, are configured to at least span the split. In other words, a length of the reference voltage plane is greater than or equal to a width of the split. The length of the reference voltage plane is determined parallel to the width dimension of the split. The first portion and the third portion may be capacitively coupled by a first intrinsic capacitance. The second portion and the third portion may be capacitively coupled by a second intrinsic capacitance. The intrinsic capacitances are related to a distance between the first layer and the second layer, properties of the dielectric material and position of the reference voltage plane relative to the signal trace and relative to the split.

The reference voltage plane may be a distance, y, from the signal trace at or near the split. The first layer may be a distance, x, from the second layer. In an embodiment, x is less than y. Layer thickness and/or separation and thus, characteristic impedance of the hybrid transmission line, may be relatively easier to control during manufacturing compared to coplanar trace and/or plane separation. Thus, manufacturing cost may be relatively less and package height may be reduced by a hybrid transmission line consistent with the present disclosure. Current return path discontinuities related to traversing splits between adjacent power planes by the signal trace may be mitigated by the coplanar reference voltage plane thus, signal transmission may be enhanced. A reference voltage layer configured to contain a current return path may be eliminated, contributing to package height and cost reduction.

FIG. 1 is a sketch 100 illustrating portions of two layers of a system consistent with one embodiment of the present disclosure. Signal traces and reference voltage planes and/or traces included in the first layer are indicated by solid lines and power planes included in the second layer are indicated by dotted lines. The first layer and the second layer may be separated by a dielectric material (not explicitly shown in this sketch for ease of illustration).

A first layer includes a first signal trace 102A, a second signal trace 102B and a plurality of reference voltage planes 120A, 120B, 120C, 120D. The reference voltage planes 120A, 120B, 120C, 120D have an associated reference voltage, VSS. For example, the first signal trace 102A and the second signal trace 102B may correspond to a differential pair. In another example, the first signal trace 102A and the second signal trace 102B may not correspond to a differential pair, i.e., may each be single-ended. In a single-ended configuration, a maximum of two signal traces may be positioned between coplanar reference voltage planes. In one example, the reference voltage, VSS, may be zero, i.e., ground. In another example, the reference voltage, VSS may be greater than or less than zero.

A second layer includes a plurality of power planes, e.g., power planes 110A, 110B, . . . , 110E. Each power plane 110A, 110B, . . . , and/or 110E may be associated with a respective voltage source and an associated respective supply voltage. At least some of the supply voltages may differ. The supply voltages differ from the reference voltage, VSS.

A first power plane 110A is adjacent to a second power plane 110B. The first power plane 110A is adjacent a third power plane 110C. The first power plane 110A and the second power plane 110B are separated by, and may define, a first split 112A. The first power plane 110A and the third power plane 110C are separated by, and may define, a second split 112B.

A first reference voltage plane 120A and a second reference voltage plane 120B are configured to span the first split 112A. A third reference voltage plane 120C is configured to span the second split 112B. The second reference voltage plane 120B and the third reference voltage plane 120C are adjacent the first signal trace 102A and the first reference voltage plane 120A is adjacent the second signal trace 102B. A fourth reference voltage plane 120D is configured to span a plurality of splits, e.g., splits 112B, 112C, based, at least in part, on routing of an associated signal trace, e.g., second signal trace 102B.

A current return path associated with the first signal trace 102A may include a plurality of portions. For example, a first portion may be included in the second power plane 110B, a second portion may be included in the third power plane 110C and a third portion may be included in the second reference voltage plane 120B at or near the first split 112A. In another example, a fourth portion may be included in the third power plane 110C and a fifth portion may be included in the third reference voltage plane 120C at or near the second split 112B.

Thus, one or more signal traces may traverse a first layer and an associated current return path for each signal trace may include a plurality of portions. At least some portions may be included in split power planes contained in a second layer and one or more portions may be included in one or more respective reference voltage planes included in the first layer, i.e., coplanar with the signal trace. The reference voltage planes may be configured to reduce discontinuities in the current return path associated with splits between adjacent power planes that are crossed, i.e., traversed, by the signal traces.

Figure 2:
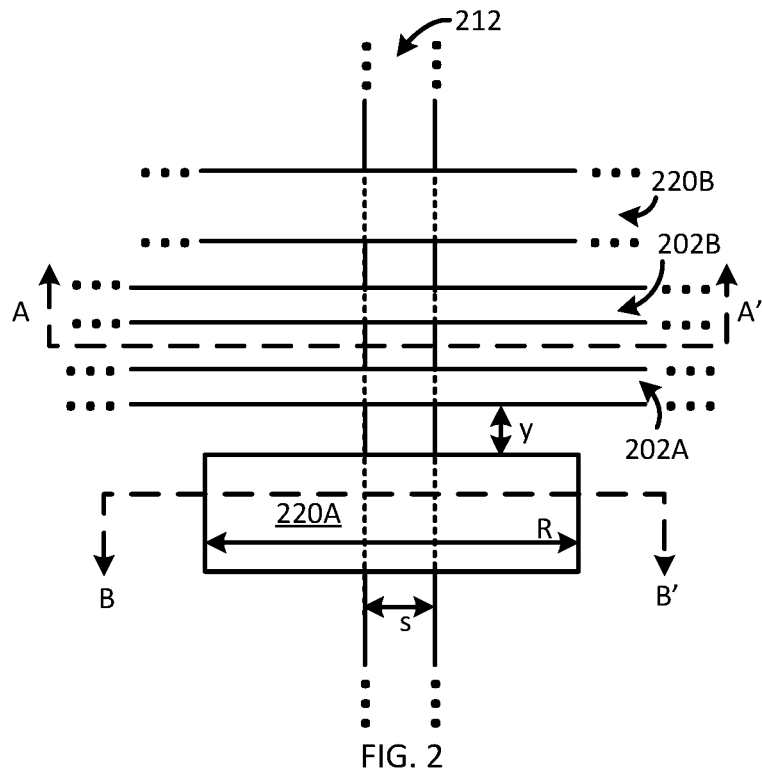
FIG. 2 illustrates a top view of a portion of a first layer of a system consistent with several embodiments of the present disclosure.
Figure 3:
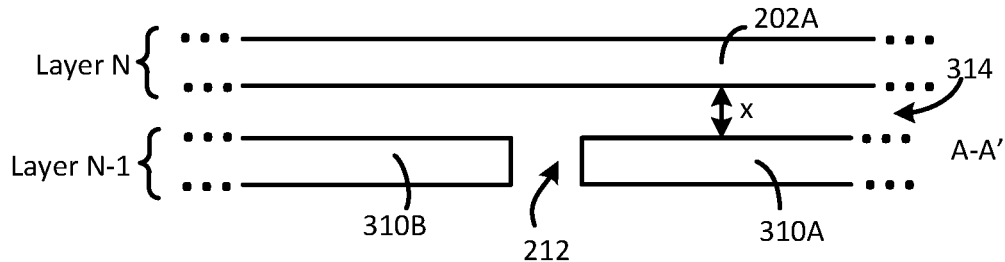
FIG. 3 illustrates an A-A' cross-section of the system of FIG. 2, consistent with several embodiments of the present disclosure.
Figure 4:
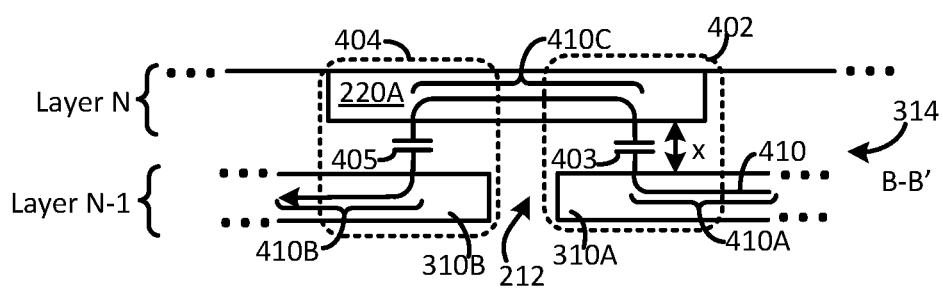
FIG. 4 illustrates a B-B' cross-section of the system of FIG. 2, consistent with several embodiments of the present disclosure.

FIG. 2 illustrates a top view of a portion 200 of a first layer of a system consistent with several embodiments of the present disclosure. FIG. 3 illustrates an A-A' cross-section 300 of the system of FIG. 2, consistent with several embodiments of the present disclosure. FIG. 4 illustrates a B-B' cross-section 400 of the system of FIG. 2, consistent with several embodiments of the present disclosure. FIGS. 2, 3 and 4 may be best understood when considered together.

Turning now to FIG. 2, portion 200 may correspond to, for example, a region of sketch 100 that includes the first split 112A, a portion of the first reference voltage plane 120A and the second reference voltage plane 120B of FIG. 1. Portion 200 includes a split 212, a first signal trace 202A, a second signal trace 202B, a first reference voltage plane 220A and a portion of a second reference voltage plane 220B. The signal traces 202A, 202B and reference voltage planes 220A, 220B may be constructed of one or more conductive materials. Conductive materials may include, but are not limited to, metal and/or metal composites, e.g., copper, aluminum, silver palladium (AgPd), gold palladium (AuPd), conductive ink, conductive elastomer, etc.

The signal traces 202A, 202B and reference voltage planes 220A, 220B cross, i.e., traverse, the split 212. In an example, one or more of the signal traces 202A, 202B and/or reference voltage planes 220A, 220B may be generally perpendicular to the split 212. In another example, one or more of the signal traces 202A, 202B and/or reference voltage planes 220A, 220B may not be perpendicular to the split 212. The first reference voltage plane 220A is adjacent the first signal trace 202A. The second signal trace 202B is adjacent the first signal trace 202A opposite the first reference voltage plane 220A. The portion of the second reference voltage plane 220B is adjacent the second signal trace 202B opposite the first signal trace 202A. The first reference voltage plane 220A is a distance, y, from the first signal trace 202A. The distance, y, may be determined at or near the split 212. For example, y may be in the range of 45 micrometers (μm) to 120 μm. For example, y may be 80 μm. The first reference voltage plane 220A has a length, R. The split 212 has a width, s. For example, s may be in the range of 40 micrometers (μm) to 80 μm. For example, s may be 50 μm. The length, R, of the first reference voltage plane 220A is greater than or equal to the width, s, of the split 212. The length dimension, R, of the reference voltage plane is parallel to the width dimension, s, of the split 212. For example, the dimensions y, s and R may be coplanar in a horizontal plane and an x dimension, as described herein, may correspond to a vertical dimension.

Turning now to FIG. 3, cross-section 300 includes a first layer, "layer N", and a second layer, "layer N−1". Cross-section 300 corresponds to cross-section A-A' of FIG. 2. Cross-section A-A' is between the first and second signal traces 202A, 202B and is parallel to a long axis of the signal traces. Layer N may be separated from layer N−1 by a dielectric material 314 of thickness, x. Dielectric materials may include, but are not limited to, liquid crystal polymer (LCP), glass fiber epoxy laminate (e.g., fire retardant FR4), polyimide film (e.g., Kapton®), glass microfiber reinforced PTFE, (polytetrafluoroethylene) (e.g., Rogers RT/Duroid® 5870/5880 high frequency laminate) and/or combinations thereof.

Layer N includes a portion of the first signal trace 202A. Layer N−1 includes a portion of a first power plane 310A and a portion of a second power plane 310B. The first power plane 310A and the second power plane 310B are separated by split 212. Layer N and layer N−1 may be separated by a distance, x (i.e., the dielectric thickness). x may be in the range of 10 micrometers (μm) to 40 μm. For example, x may be 20 μm. The first power plane 310A and the second power plane 310B may each include a respective portion of a current return path associated with the first signal trace 202A, as described herein.

The dimension, x, may be generally perpendicular to the dimensions y, s and R (of FIG. 2). For example, y, s and R may be horizontal dimensions and x may be a vertical dimension. "Horizontal" and "vertical", as used herein, are relative terms and are not meant to indicate absolute physical orientation in space.

Turning now to FIG. 4, cross-section 400 includes a first region 402, a second region 404 and a current return path 410. Cross-section 400 further includes split 212, layer N, layer N−1 and the dielectric material 314. Cross-section 400 corresponds to cross-section B-B' of FIG. 2. Cross-section B-B' cuts the first reference voltage plane 220A, is parallel to a long axis of the signal traces 202A, 202B and is generally perpendicular to the split 212. Layer N includes the first reference voltage plane 220A, i.e., the first reference voltage plane 220A is coplanar with the first signal trace 202A. The first reference voltage plane 220A is configured to span the split 212 and includes a portion of the current return path 410 associated with the first signal trace 202A.

A first supply voltage associated with the first power plane 310A is different from a second supply voltage associated with the second power plane 310B. A reference voltage, VSS, associated with the first reference voltage plane 220A differs from both the first supply voltage and the second supply voltage.

The first region 402 includes a first portion of the first reference voltage plane 220A and a portion of the first power plane 310A at or near the split 212. The second region 404 includes a second portion of the first reference voltage plane 220A and a portion of the second power plane 310B at or near the split 212. The first region 402 may include a first intrinsic capacitance 403 related to the first reference voltage plane 220A, the first power plane 310A and the dielectric 314. Similarly, the second region 404 may include a second intrinsic capacitance 405 related to the first reference voltage plane 220A, the second power plane 310B and the dielectric 314. Respective values of the intrinsic capacitances 403, 405 are related to the dielectric thickness, i.e., the distance, x, between layer N and layer N−1, properties (e.g., relative permittivity, $\varepsilon_r$) of the dielectric 314, and an area of overlap, if any, between the reference voltage plane 220A and the respective power plane, 310A, 310B. The split 212 produces a discontinuity in a current return path associated with a trace, e.g., the first signal trace 202A, that crosses the split 212. Intrinsic capacitance 403 is configured to guide (i.e., "steer") the return current (at the first power plane 310A) to the first reference voltage plane 220A at or near the split 212. Similarly, the intrinsic capacitance 405 is configured to guide the return current (from the first reference voltage plane 220A) to the second power plane 310B at or after the split 212.

The current return path 410 associated with the first signal trace 202A may include a plurality of portions 410A, 410B, 410C. For example, the first portion 410A may be included in the first power plane 310A, the second portion 410B may be included in the second power plane 310B and the third portion 410C may be included in the first reference voltage plane 220A. The first portion 410A and the third portion 410C may be capacitively coupled by the intrinsic capacitance 403 of the first region 402. The second portion 410B and the third portion 410C may be capacitively coupled by the intrinsic capacitance 405 of the second region 404.

Thus, discontinuities between the current return path 410A and current return path 410B associated with traversing split 212 may be mitigated by the current return path 410C included in the first reference voltage plane 220A. The first reference voltage plane 220A and the intrinsic capacitances may facilitate utilizing the layer N−1 split power planes, e.g., power planes 310A, 310B for a current return path. For example, the intrinsic capacitances 403, 405 may block DC voltages. In another example, the intrinsic capacitances 403, 405 may guide the return current at, near and/or after the split 212, as described herein.

Figure 5:
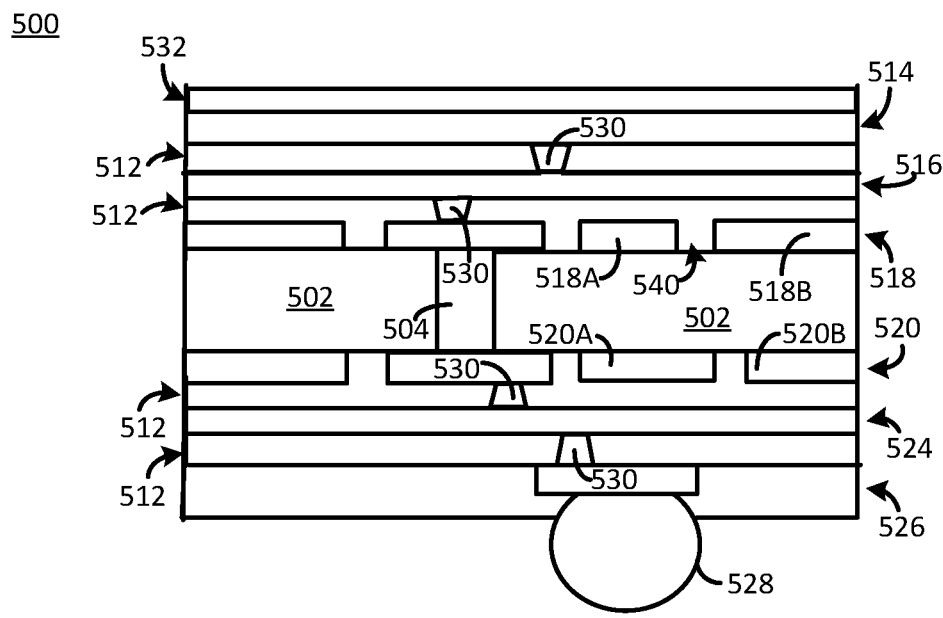
FIG. 5 is one example cross-section illustrating signal routing on dielectric.

FIG. 5 illustrates one example cross-section 500 illustrating signal routing on dielectric. Signal routing on dielectric corresponds to power planes adjacent a package core layer. Example cross-section 500 includes a package core layer 502, a plated through hole 504 and a plurality of dielectric layers 512. The package core layer 502 may include, for example, an organic polymer reinforced core, e.g., bismaleimide triazine epoxy resin, silicon and/or a flexible glass core. Each dielectric layer 512 is sandwiched between two adjacent conductive layers. The conductive layers may include conductive (e.g., metal) and non-conductive (e.g., dielectric) portions, with conductive portions interleaved with non-conductive portions. Each conductive layer may include a plurality of conductive pads and/or split power planes or at least one signal trace and at least one reference voltage plane. Example cross-section 500 includes a first conductive layer 514 (layer 1), a first signal/reference voltage layer 516 (layer 2), a first power plane layer 518 (layer 3), a second power plane layer 520 (layer 4) and a second signal/reference voltage layer 524 (layer 5). Example cross-section 500 may further include a ball grid array pad layer 526 (layer 6), a ball grid array ball 528 and a solder resist layer 532. Example cross-section 500 may further include one or more micro-vias 530.

In an embodiment, the first conductive layer 514 (layer 1) may include one or more conductive pads, e.g., wire bond pads and/or bump pads that facilitate electrical interconnection with one or more silicon dies (not shown) coupled to the package. The electrical interconnection may be formed through, for example, wire bond and/or solder bump.

Example cross-section 500 thus illustrates a 6-layer package configuration. In an embodiment, layers 1 and 5 may be excluded, resulting in a 4-layer package configuration. In the 4-layer package configuration, the features of the excluded layers, e.g., conductive pads (layer 1) and the second signal/ reference voltage plane 524 (layer 5) may be included in the first signal/reference voltage plane 516 (layer 2) and the ball grid array pad layer 526 (layer 6), respectively. A device that includes the 4-layer package configuration may have a reduced package height and costs relative to a device that includes the 6-layer package configuration.

The plated through hole 504 is configured to provide a conductive path between signal/reference voltage layers and/or power plane layers across the package core layer 502. The micro-vias 530 are configured to provide conductive paths between signal/reference voltage layers that are on a same side of the package core layer 502. One or more micro-vias 530 may be configured to provide a conductive path between the ball grid array ball 528 and at least the second signal/reference voltage layer 524.

The first power plane layer 518 contains a plurality of power planes, e.g., power planes 518A, 518B. A first power plane 518A is separated from the second power plane 518B by a split 540. A first supply voltage associated with the first power plane 518A is different from a second supply voltage associated with the second power plane 518B. The first supply voltage and the second supply voltage differ from a reference voltage associated with a reference voltage plane included in, e.g., the first signal/reference voltage layer 516. The second power plane layer 520 contains a plurality of power planes, e.g., power planes 520A, 520B. Each power plane of the plurality of power planes contained in a power plane layer may be coupled to respective power sources. In this example cross-section 500, the power plane layers 518, 520 are positioned adjacent the package core layer 502 and the signal/reference voltage layers are positioned adjacent dielectric layers 512.

Thus, example cross-section 500 illustrates a plurality of hybrid transmission lines, consistent with various embodiments of the present disclosure. For example, a first hybrid transmission line may include portions of the first signal/reference voltage layer 516 (layer 2) and portions of the first power plane layer 518 (layer 3). In another example, a second hybrid transmission line may include portions of the second power plane layer 520 (layer 4) and portions of the second signal/reference voltage layer 524 (layer 5).

Figure 6:
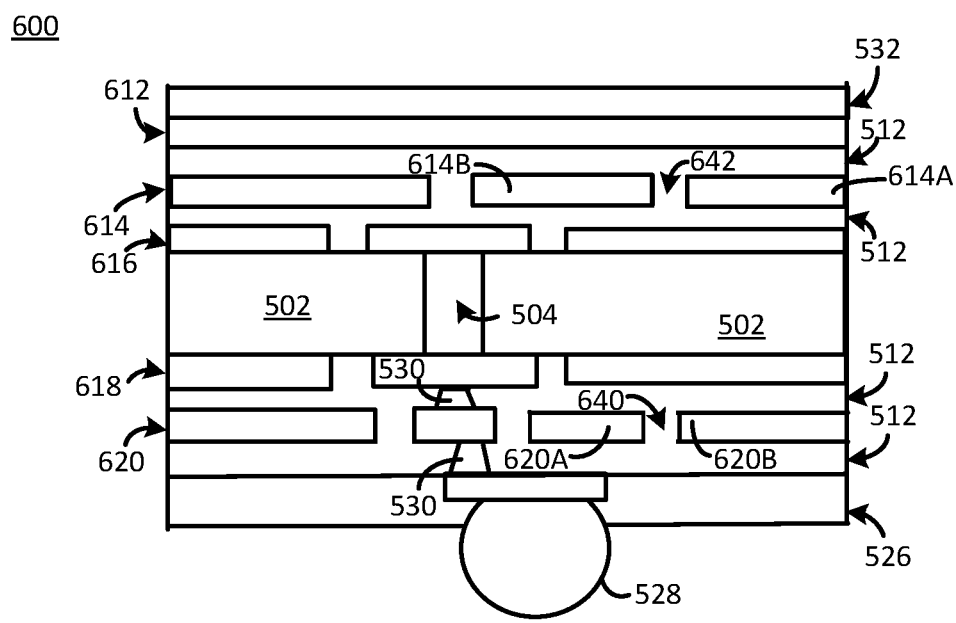
FIG. 6 is another example cross-section illustrating signal routing on package core layer.

FIG. 6 illustrates another example cross-section 600 illustrating signal routing on package core layer. Signal routing on package core layer corresponds to layers including signal traces and/or reference voltage planes adjacent the core layer. Example cross-section 600 includes the package core layer 502, the plated through hole 504 and the plurality of dielectric layers 512. The package core layer 502 may include, for example, an organic polymer reinforced core, e.g., bismaleimide triazine epoxy resin, silicon and/or flexible glass core. Each dielectric layer 512 is sandwiched between two adjacent conductive layers. The conductive layers (i.e., layer 1 to layer 6) may include conductive (e.g., metal) and non-conductive (e.g., dielectric) portions, with conductive portions interleaved with non-conductive portions. Example cross-section 600 includes a first signal/reference voltage layer 612 (layer 1), a first split power plane layer 614 (layer 2), a second signal/reference voltage layer 616 (layer 3), a third signal/reference voltage layer 618 (layer 4) and a second split power plane layer 620 (layer 5). Example cross-section 600 may further include the ball grid array pad layer 526 (layer 6), the ball grid array ball 528 and the solder resist layer 532. Example cross-section 600 may further include one or more micro-vias 530.

In an embodiment, the first signal/reference voltage layer 612 (layer 1) may include one or more conductive pads, e.g., wire bond pads and/or bump pads, that facilitate electrical interconnection with one or more silicon dies (not shown) coupled to the package. The electrical interconnection may be formed through, for example, wire bond and/or solder bump.

The first power plane layer 614 contains a plurality of split power planes, e.g., power planes 614A, 614B. Power planes 614A and 614B may define, and be separated by, a first split 642. The second power plane layer 620 contains a plurality of spit power planes, e.g., power planes 620A, 620B. The plurality of power planes 620A, 620B may define and be separated by a second split 640. A first supply voltage associated with a first power plane 614A is different from a second supply voltage associated with a second power plane 614B. The first supply voltage and the second supply voltage differ from a reference voltage associated with a reference voltage plane included in, e.g., the first signal/reference voltage layer 612 and/or the second signal/reference voltage layer 616.

Thus, example cross-section 600 illustrates a plurality of hybrid transmission lines consistent with various embodiments of the present disclosure. For example, a first hybrid transmission line may include portions of the first split power layer 614 (layer 2) and portions of the second signal/reference voltage layer 616 (layer 3). In another example, a second hybrid transmission line may include portions of the first split power layer 614 (layer 2) and portions of the first signal/reference voltage layer 612 (layer 1). In another example, a third hybrid transmission line may include portions of the third signal/reference voltage layer 618 (layer 4) and portions of the second split power plane 620 (layer 5).

Figure 7:
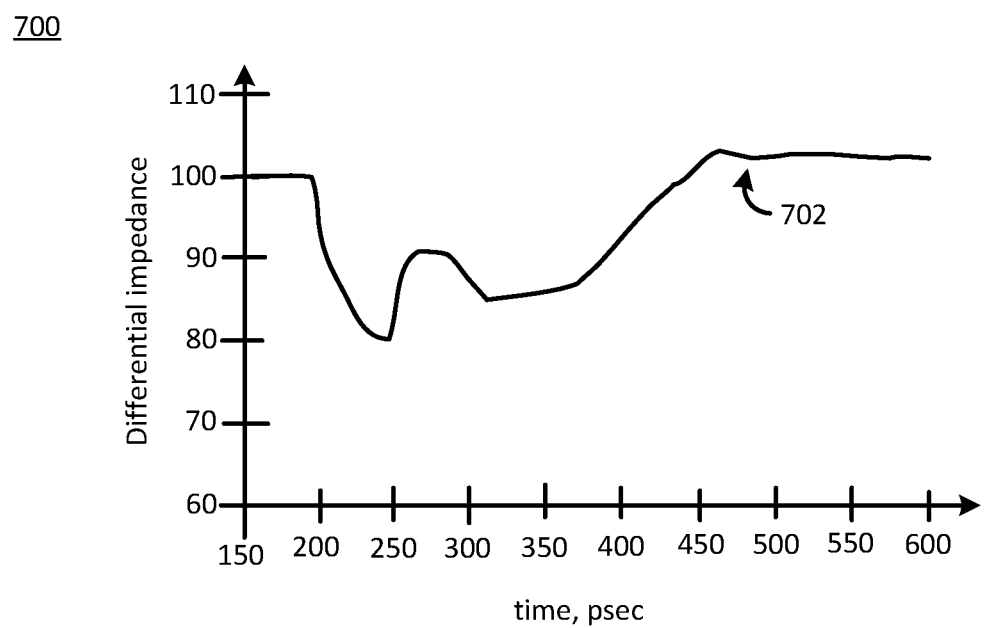
FIG. 7 is a plot of a time domain reflectometry (TDR) results illustrating differential impedance of one example system, consistent with one embodiment of the present disclosure.

FIG. 7 is a plot 700 of a time domain reflectometry (TDR) result illustrating differential impedance of one example system, consistent with one embodiment of the present disclosure. The plot 700 includes a differential impedance waveform 702 for a differential pair of signal traces configured as hybrid transmission lines, consistent with the present disclosure. The target differential impedance is 85 ohms between about 200 and about 400 picoseconds (psec). The actual differential impedance for the time range is 85 ohms plus or minus 5 ohms.

Thus, a hybrid transmission line may include a signal trace and a current return path. The current return path includes a portion that is coplanar with the signal trace and a portion that is not coplanar with the signal trace. For example, the signal trace and a portion of the current return path may be included in a first layer and a portion of the current return path may be included in a second layer. The second layer is adjacent the first layer and separated from the first layer by a dielectric material. The first layer includes a plurality of conductive traces and/or conductive planes including the signal trace and one or more reference voltage planes. The second layer includes a plurality of split power planes, each power plane separated from each adjacent power plane by a split. The split may contain an insulating material, e.g., a dielectric material. Each power plane is associated with a respective supply voltage. The reference voltage plane is associated with a reference voltage, VSS. For example, VSS may be zero (i.e., ground). In another example, VSS may be greater than or less than zero. The reference voltage, VSS, differs from the supply voltages associated with the power planes. In other words, a voltage difference ΔV between a power plane and the reference voltage plane is nonzero. The first and second layers may be included in a device, including, but not limited to, an integrated circuit, a printed circuit board (PCB), a system on a chip, a system in a package, etc.

The reference voltage plane may be a distance, y, from the signal trace at or near the split. The first layer may be a distance, x, from the second layer. In an embodiment, x is less than y. Layer thickness and/or separation and thus, characteristic impedance of the hybrid transmission line, may be relatively easier to control during manufacturing compared to coplanar trace separation. Thus, manufacturing cost may be relatively less and package height may be reduced by a hybrid transmission line consistent with the present disclosure. Current return path discontinuities related to traversing splits between adjacent power planes by the signal trace may be mitigated by the coplanar reference voltage plane thus, signal transmission may be enhanced. An additional reference voltage layer configured to contain a current return path may be eliminated, contributing to package height and cost reduction.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog-Unified Hardware Design, Specification, and Verification Language, dated Jul. 7, 2011; IEEE Std 1800™-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a method, means for performing acts of the method, a device, or of an apparatus or system related to hybrid transmission line, as discussed below.

Example 1

According to this example, there is provided an apparatus. The apparatus includes a first signal trace and a current return path. The current return path includes a plurality of portions. The plurality of portions includes a first portion, a second portion, and a third portion. The first portion is included in a first power plane. The second portion is included in a second power plane coplanar with the first power plane and separated from the first power plane by a split. The third portion spans the split and is included in a reference voltage plane. The reference voltage plane is coplanar with the first signal trace. The reference voltage plane is separated from the first power plane and the second power plane by a dielectric material.

Example 2

This example includes the elements of example 1, wherein the first portion is capacitively coupled to the third portion by a first intrinsic capacitance and the second portion is capacitively coupled to the third portion by a second intrinsic capacitance.

Example 3

This example includes the elements of example 1, wherein a first power plane voltage associated with the first power plane differs from a second power plane voltage associated with the second power plane and the first power plane voltage and the second power plane voltage both differ from a reference voltage associated with the reference voltage plane.

Example 4

This example includes the elements according to any one of examples 1 through 3, wherein the signal trace and the third portion are adjacent a package core layer.

Example 5

This example includes the elements according to any one of examples 1 through 3, wherein the first portion and the second portion are adjacent a package core layer.

Example 6

This example includes the elements according to any one of examples 1 through 3, further including a second signal trace coplanar with the first signal trace, the first signal trace and the second signal trace to carry a differential signal.

Example 7

This example includes the elements according to any one of examples 1 through 3, wherein the first portion and the second portion are each positioned a distance, x, from the third portion and the third portion is positioned a distance, y, from the first signal trace.

Example 8

This example includes the elements of example 7, wherein the distance, x, is less than the distance, y.

Example 9

This example includes the elements of example 7, wherein the distance, x, is in the range of 10 micrometers (μm) to 40 μm.

Example 10

This example includes the elements of example 7, wherein the distance, y, is in the range of 45 micrometers (μm) to 120 μm.

Example 11

According to this example, there is provided a device. The device includes a first layer and a second layer. The first layer includes a first signal trace and a first reference voltage plane. The first reference voltage plane is positioned a distance, y, from the first signal trace. The second layer is positioned a distance, x, from the first layer. The second layer is separated from the first layer by a dielectric material.

The second layer includes a plurality of power planes. The first power plane of the plurality of power planes is separated from an adjacent second power plane by a split having a width, s. At least a portion of the first reference voltage plane spans the split. The first power plane includes a first portion of a current return path associated with the first signal trace. The second power plane includes a second portion of the current return path. The first reference voltage plane includes a third portion of the current return path. The third portion of the current return path spans the split.

Example 12

This example includes the elements of example 11, wherein the first portion is capacitively coupled to the third portion by a first intrinsic capacitance and the second portion is capacitively coupled to the third portion by a second intrinsic capacitance.

Example 13

This example includes the elements of example 11, wherein a first power plane voltage associated with the first power plane differs from a second power plane voltage associated with the second power plane and the first power plane voltage and the second power plane voltage both differ from a reference voltage associated with the first reference voltage plane.

Example 14

This example includes the elements according to any one of examples 11 through 13, wherein the first signal trace and the third portion are adjacent a package core layer.

Example 15

This example includes the elements according to any one of examples 11 through 13, wherein the first portion and the second portion are adjacent a package core layer.

Example 16

This example includes the elements according to any one of examples 11 through 13, wherein the first layer further includes a second signal trace, the first signal trace and the second signal trace to carry a differential signal.

Example 17

This example includes the elements according to any one of examples 11 through 13, wherein the distance, x, is less than the distance, y.

Example 18

This example includes the elements according to any one of examples 11 through 13, wherein the distance, x, is in the range of 10 micrometers (μm) to 40 μm.

Example 19

This example includes the elements according to any one of examples 11 through 13, wherein the distance, y, is in the range of 45 micrometers (μm) to 120 μm.

Example 20

This example includes the elements according to any one of examples 11 through 13, wherein the first layer includes a plurality of reference voltage planes.

Example 21

This example includes the elements according to any one of examples 11 through 13, wherein the first signal trace and first reference voltage plane span a plurality of splits.

Example 22

According to this example, there is provided a system. The system includes a device. The device includes a package core layer, a first layer, a second layer, and a current return path. The first layer includes a first signal trace and a first reference voltage plane. The first reference voltage plane is coplanar with the first signal trace. The second layer is separated from the first layer by a dielectric material. The second layer includes a first power plane and a second power plane. The second power plane is adjacent the first power plane and is separated from the first power plane by a split. The current return path includes a plurality of portions. The plurality of portions includes a first portion, a second portion, and a third portion. The first portion is included in the first power plane. The second portion is included in the second power plane. The third portion is included in the first reference voltage plane and spans the split.

Example 23

This example includes the elements of example 22, wherein the first portion is capacitively coupled to the third portion by a first intrinsic capacitance and the second portion is capacitively coupled to the third portion by a second intrinsic capacitance.

Example 24

This example includes the elements of example 22, wherein a first power plane voltage associated with the first power plane differs from a second power plane voltage associated with the second power plane and the first power plane voltage and the second power plane voltage both differ from a reference voltage associated with the first reference voltage plane.

Example 25

This example includes the elements according to any one of examples 22 through 24, wherein the first layer is adjacent the package core layer.

Example 26

This example includes the elements according to any one of examples 22 through 24, wherein the second layer is adjacent the package core layer.

Example 27

This example includes the elements according to any one of examples 22 through 24, wherein the first layer further includes a second signal trace, the first signal trace and the second signal trace to carry a differential signal.

Example 28

This example includes the elements according to any one of examples 22 through 24, wherein the third portion is positioned a distance, y, from the first signal trace and the second layer is positioned a distance, x, from the first layer.

Example 29

This example includes the elements of example 28, wherein the distance, x, is less than the distance, y.

Example 30

This example includes the elements of example 28, wherein the distance, x, is in the range of 10 micrometers (μm) to 40 μm.

Example 31

This example includes the elements of example 28, wherein the distance, y, is in the range of 45 micrometers (μm) to 120 μm.

Example 32

This example includes the elements according to any one of examples 22 through 24, wherein the device is selected from the group including an integrated circuit, a printed circuit board (PCB), a system on a chip and a system in a package.

Example 33

This example includes the elements according to any one of examples 22 through 24, wherein the first layer includes a plurality of reference voltage planes.

Example 34

This example includes the elements according to any one of examples 22 through 24, wherein the first signal trace and first reference voltage plane span a plurality of splits.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:
1. A system comprising: a device comprising:
    a package core layer;
    a first layer comprising a first signal trace and a first reference voltage plane coplanar with the first signal trace, wherein the first signal trace is a non-linear signal trace;
    a second layer separated from the first layer by a dielectric material, the second layer comprising a first power plane and a second power plane adjacent the first power plane and separated from the first power plane by a first split, and the second layer comprising a third power plane adjacent the second power plane and separated from the second power plane by a second split; and
    a current return path comprising a plurality of portions, the plurality of portions comprising a first portion included in the first power plane, a second portion included in the second power plane, a third portion included in the first reference voltage plane and spanning the first split, and a fourth portion included in the third power plane, wherein the third portion further spans the second split, wherein the first power plane and the second power plane and the third power plane have a supply voltage different than a reference voltage of the first reference voltage plane.

2. The system of claim 1, wherein the third portion is positioned a distance y from the first signal trace and the second layer is positioned a distance x from the first layer.

3. The system of claim 2, wherein the distance x is less than the distance y.

4. The system of claim 2, wherein the distance x is in the range of 10 micrometers (μm) to 40 μm.

5. The system of claim 2, wherein the distance y is in the range of 45 micrometers (μm) to 120 μm.

6. The system of claim 1, wherein the first portion is capacitively coupled to the third portion by a first intrinsic capacitance and the second portion is capacitively coupled to the third portion by a second intrinsic capacitance.

7. The system of claim 1, wherein the first layer is adjacent the package core layer.

8. The system of claim 1, wherein the second layer is adjacent the package core layer.

9. The system of claim 1, wherein the first layer further comprises a second signal trace, the first signal trace and the second signal trace to carry a differential signal.

10. The system of claim 1, wherein the device is selected from the group comprising an integrated circuit, a printed circuit board (PCB), a system on a chip and a system in a package.

11. An apparatus comprising:
    a first signal trace, wherein the first signal trace is a non-linear signal trace; and
    a current return path, the current return path comprising a plurality of portions, the plurality of portions comprising:
        a first portion included in a first power plane, a second portion included in a second power plane coplanar with the first power plane and separated from the first power plane by a first split, a third portion spanning the first split and included in a reference voltage plane, and a fourth portion included in a third power plane coplanar with the second power plane and separated from the second power plane by a second split, wherein the third portion further spans the second split, the reference voltage plane coplanar with the first signal trace and separated from the first power plane and the second power plane and the third power plane by a dielectric material, wherein the first power plane and the second power plane and the third power plane have a supply voltage different than a reference voltage of the reference voltage plane.

12. The apparatus of claim 11, wherein the first portion and the second portion are each positioned a distance x from the third portion and the third portion is positioned a distance y from the first signal trace.

13. The apparatus of claim 12, wherein the distance x is less than the distance y.

14. The apparatus of claim 12, wherein the distance x is in the range of 10 micrometers (μm) to 40 μm.

15. The apparatus of claim 12, wherein the distance y is in the range of 45 micrometers (μm) to 120 μm.

16. The apparatus of claim 11, wherein the first portion is capacitively coupled to the third portion by a first intrinsic capacitance and the second portion is capacitively coupled to the third portion by a second intrinsic capacitance.

17. A device comprising:
a first layer comprising a first signal trace and a first reference voltage plane positioned a distance y from the first signal trace, wherein the first signal trace is a non-linear signal trace;
a second layer positioned a distance x from the first layer and separated from the first layer by a dielectric material, the second layer comprising a plurality of power planes, a first power plane separated from an adjacent second power plane by a first split having a width, s, and a third power plane separated from the second power plane by a second split, wherein at least a portion of the first reference voltage plane spans both the first split and the second split, the first power plane comprises a first portion of a current return path associated with the first signal trace, the second power plane comprises a second portion of the current return path, the first reference voltage plane comprises a third portion of the current return path, and the third power plane comprises a fourth portion of the current return path, wherein the first power plane and the second power plane and the third power plane have a supply voltage different than a reference voltage of the first reference voltage plane.

18. The device of claim 17, wherein the first portion is capacitively coupled to the third portion by a first intrinsic capacitance and the second portion is capacitively coupled to the third portion by a second intrinsic capacitance.

19. The device of claim 17, wherein the first layer further comprises a second signal trace, the first signal trace and the second signal trace to carry a differential signal.

20. The device of claim 17, wherein the distance x is in the range of 10 micrometers (μm) to 40 μm.

21. The device of claim 17, wherein the distance y is in the range of 45 micrometers (μm) to 120 μm.

* * * * *